United States Patent [19]

Christopher

[11] Patent Number: 5,084,700
[45] Date of Patent: Jan. 28, 1992

[54] SIGNAL CLAMP CIRCUITRY FOR ANALOG-TO-DIGITAL CONVERTERS

[75] Inventor: Todd J. Christopher, Indianapolis, Ind.

[73] Assignee: Thomson Consumer Electronics, Inc., Indianapolis, Ind.

[21] Appl. No.: 650,330

[22] Filed: Feb. 4, 1991

[51] Int. Cl.⁵ .................... H03M 1/06; H04N 5/18
[52] U.S. Cl. .................... 341/118; 341/155; 358/172
[58] Field of Search ............. 341/118, 155, 126, 156, 341/159; 307/568, 461, 464; 358/172

[56] References Cited

U.S. PATENT DOCUMENTS

| | | | |
|---|---|---|---|
| 3,221,253 | 11/1965 | Keyes | 341/154 X |
| 4,110,745 | 8/1978 | Ninomiya | 341/156 |
| 4,410,876 | 10/1983 | Sawagata | 341/156 X |
| 4,707,741 | 11/1987 | Stratton | 358/172 X |
| 4,736,117 | 4/1988 | Wieser | 307/568 X |
| 4,811,016 | 3/1989 | Millward et al. | 358/172 X |
| 4,859,871 | 8/1989 | Kobayashi et al. | 307/264 |
| 4,982,191 | 1/1991 | Ohta | 341/118 |
| 4,998,106 | 3/1991 | Koga et al. | 341/118 |
| 5,003,564 | 3/1991 | Fling | 358/172 X |

Primary Examiner—A. D. Pellinen
Assistant Examiner—Sharon D. Logan
Attorney, Agent, or Firm—Joseph S. Tripoli; Eric P. Herrmann; Ronald H. Kurdyla

[57] ABSTRACT

Clamping circuitry for adjusting the D.C. voltage of a signal which is A.C. coupled to an ADC includes D.C. level adjusting circuitry coupled to the input of the ADC. Logic circuitry, responsive to a single bit of output samples provided by the ADC, provides control signals to the D.C. level adjusting circuitry, to condition the D.C. level adjusting circuitry to adjust the D.C. level of the A.C. signal to a desired value.

11 Claims, 3 Drawing Sheets

FIG. 4

| VALUE | 7 | 6 | 5 | 4 | 3 | 2 | 1 | 0 | BIT NO. |
|---|---|---|---|---|---|---|---|---|---|
| 255 | 1 | 1 | 1 | 1 | 1 | 1 | 1 | 1 | |
| 254 | 1 | 1 | 1 | 1 | 1 | 1 | 1 | 0 | |
| 253 | 1 | 1 | 1 | 1 | 1 | 1 | 0 | 1 | |
| ... | | | | | | | | | |
| 128 | 1 | 0 | 0 | 0 | 0 | 0 | 0 | 0 | |
| 127 | 0 | 1 | 1 | 1 | 1 | 1 | 1 | 1 | |
| 126 | 0 | 1 | 1 | 1 | 1 | 1 | 1 | 0 | |
| ... | | | | | | | | | |
| 2 | 0 | 0 | 0 | 0 | 0 | 0 | 1 | 0 | |
| 1 | 0 | 0 | 0 | 0 | 0 | 0 | 0 | 1 | |
| 0 | 0 | 0 | 0 | 0 | 0 | 0 | 0 | 0 | |

FIG. 5

| VALUE | 7 | 6 | 5 | 4 | 3 | 2 | 1 | 0 | BIT NO. |
|---|---|---|---|---|---|---|---|---|---|
| 127 | 0 | 1 | 1 | 1 | 1 | 1 | 1 | 1 | |
| 126 | 0 | 1 | 1 | 1 | 1 | 1 | 1 | 0 | |
| 125 | 0 | 1 | 1 | 1 | 1 | 1 | 0 | 1 | |
| ... | | | | | | | | | |
| 0 | 0 | 0 | 0 | 0 | 0 | 0 | 0 | 0 | |
| -1 | 1 | 1 | 1 | 1 | 1 | 1 | 1 | 1 | |
| -2 | 1 | 1 | 1 | 1 | 1 | 1 | 1 | 0 | |
| ... | | | | | | | | | |
| -126 | 1 | 0 | 0 | 0 | 0 | 0 | 1 | 1 | |
| -127 | 1 | 0 | 0 | 0 | 0 | 0 | 0 | 1 | |
| -128 | 1 | 0 | 0 | 0 | 0 | 0 | 0 | 0 | |

SIGNAL CLAMP CIRCUITRY FOR ANALOG-TO-DIGITAL CONVERTERS

This invention relates to circuitry for clamping the D.C. component of A.C. signals applied to an analog-to-digital converter (ADC).

BACKGROUND OF THE INVENTION

When A.C. Signals are coupled to an ADC, the average or D.C. component must be established at a predetermined voltage level in order to efficiently utilize the dynamic range of the ADC. In addition, it is frequently desired to multiplex a plurality of signals to the input of a common ADC, and to insure that the D.C. levels of the plurality of signals are clamped to the same level. For example, in television receivers which digitally process modulated color component signals separately, it is necessary to insure that the average value (e.g., zero) of the component signals is accurately established in order to avoid introducing color errors in the reproduced images.

A typical ADC input clamp circuit is described in U.S. Pat. No. 4,859,871, wherein a comparator is coupled at the output of an ADC to provide clamp control signals to a D.C. clamping circuit at the input of the ADC. During intervals when the signal amplitude should be at a known or predetermined level, the signal is compared against a fixed reference to provide a measure of the difference between the desired D.C. input signal level and the actual D.C. input signal level. The difference value is arranged to cause the clamping circuit to adjust the actual D.C. level in the direction to attain the desired level. At the end of the comparison interval the D.C. adjusting circuitry is effectively disconnected from the input signal path. The input D.C. level is held until the next comparison interval by virtue of being stored on a capacitor in the input signal circuit path.

The comparison circuitry of known ADC clamp circuits tends to be relatively complicated. According to the present invention the comparison circuitry of ADC input clamping circuitry may be eliminated.

SUMMARY OF THE INVENTION

Clamping circuitry for adjusting the D.C. voltage of a signal which is A.C. coupled to an ADC includes D.C. level adjusting circuitry coupled to the input of the ADC. Logic circuitry, responsive to a single bit of output samples provided by the ADC, provides control signals to the D.C. level adjusting circuitry.

BRIEF DESCRIPTION OF THE DRAWINGS

FIGS. 4 and 5 are listings (in part) of bit patterns for 8-bit binary and two's complement values respectively.

DETAILED DESCRIPTION

The invention will be described in the environment of a video signal processing system, however it should be appreciated that it is not limited to such applications.

Figure 1:
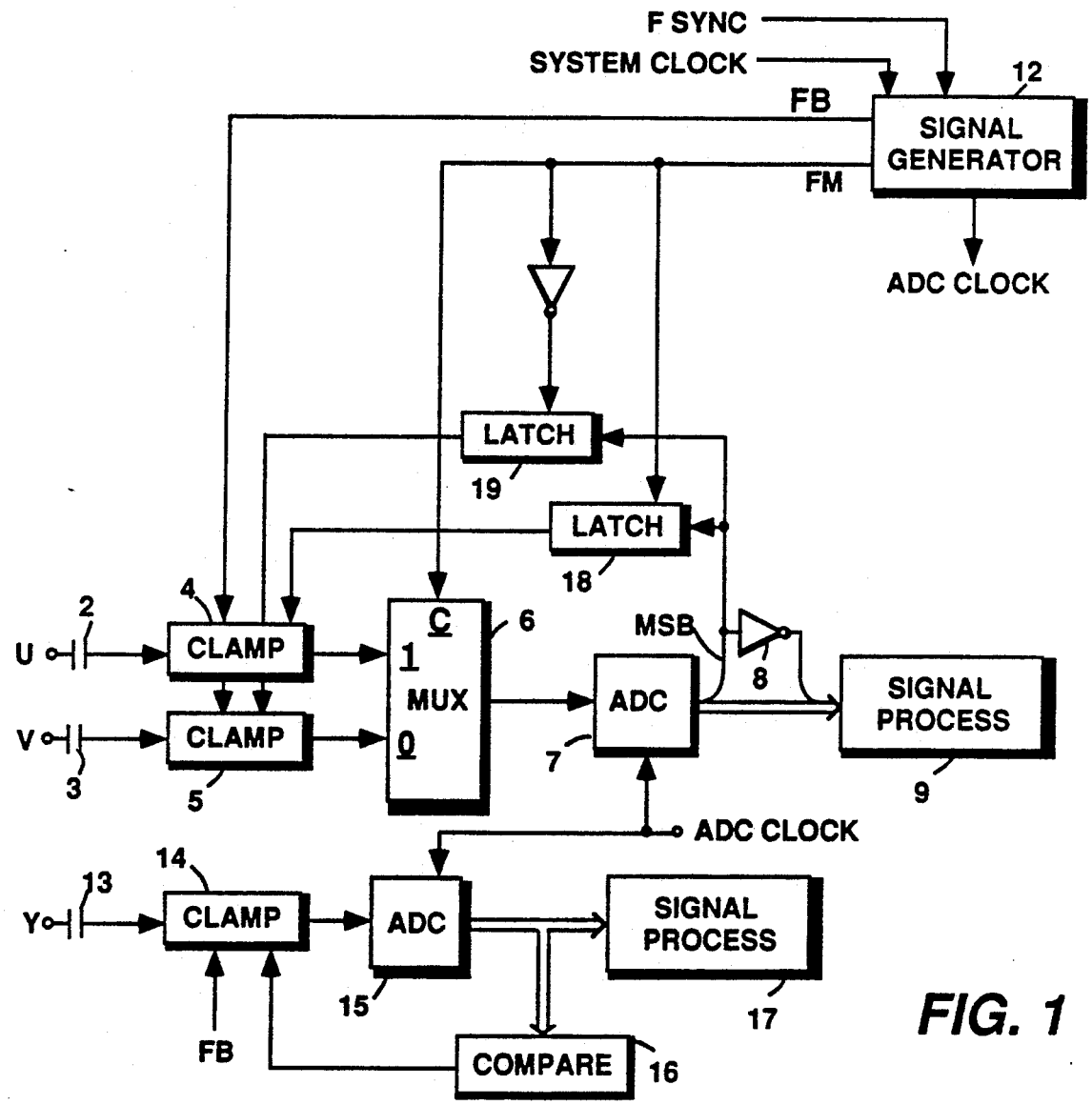
FIG. 1 is a block diagram of a portion of a video signal processing circuit incorporating the invention.

In FIG. 1 three analog video component signals, Y (luminance) U and V (color difference signals), supplied from a source (not shown) are applied to respective coupling capacitors 13, 2 and 3. The Y signal is applied to an ADC 15 via a D.C. clamp 14 which adjusts the D.C. value of the luminance signal applied to the ADC 15. The ADC 15 generates digital (e.g., binary) representations of the luminance signal, which are applied to the signal processing circuitry 17 for subsequent processing in the digital signal domain. Output samples from the ADC 15 are also coupled to a comparator 16, which examines samples during each horizontal blanking interval (e.g., black level samples) and generates a signal for controlling the clamp circuitry 14.

The U and V color difference signals are coupled to respective input terminals (1, 0) of a two-to-one analog signal multiplexor 6 via the D.C. clamp circuits 4 and 5. The multiplexor 6 alternately couples the U and V signals to the input terminal of an ADC 7 which provides interleaved digital representations of the U and V signals to a digital signal processor 9.

The clamp circuits 4 and 5 are controlled by the most significant bit, MSB, of the digital samples provided by the ADC 7. Since the signals are time division multiplexed by the multiplexor 6, and the ADC 7 provides interleaved signal samples, the clamp circuits 4 and 5 must be appropriately timed or synchronized to be responsive to corresponding output signals.

The signal generator 12 provides the appropriate synchronizing signals. Assume that a horizontal line synchronization signal F SYNC and a system clock signal are applied to the signal generator 12. The signal generator 12 develops, by conventional methods, three signals, FM, FB and ADC CLOCK. These signals are illustrated in part in FIG. 2. The ADC clock signal is applied to control the signal conversion instants of the ADC's 7 and 15. The rate of the ADC clock may be a multiple of the chrominance component subcarrier frequency. The signal FM is the multiplexor control clock, which in this example is at one half the rate of the signal ADC CLOCK. When the signal FM is high and low it causes the multiplexer to couple the signals V and U respectively to the ADC 7. Thus every other digital sample provided by the ADC 7 corresponds to samples of the signal U, and intervening digital samples correspond to samples of the signal V.

Figure 2:
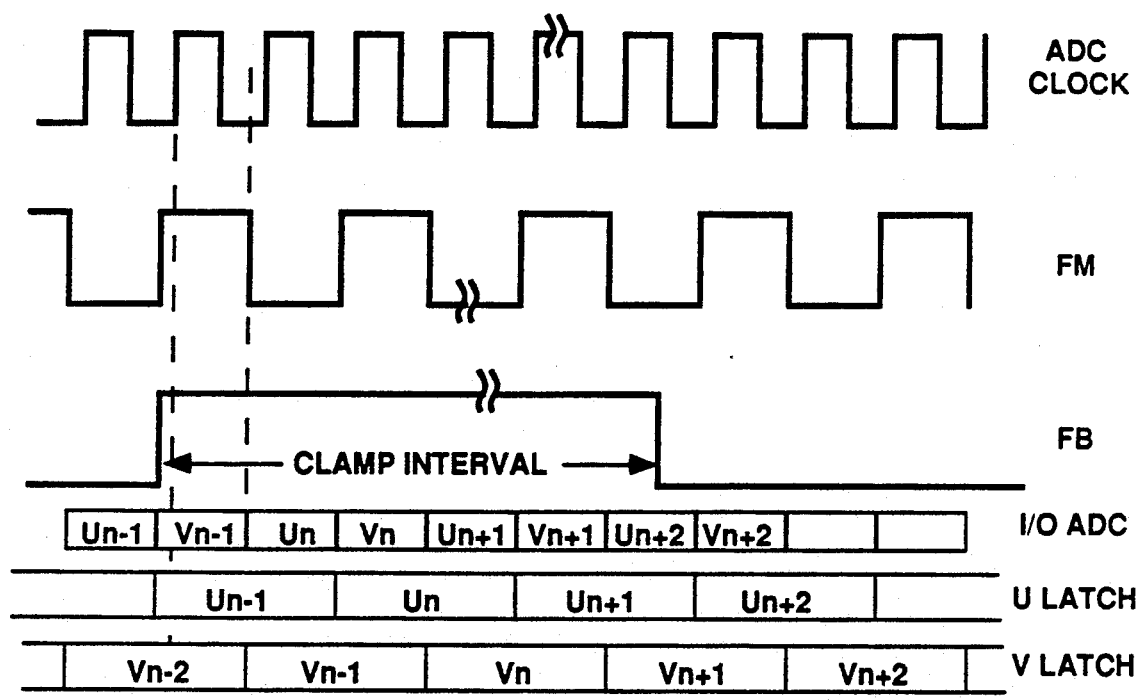
FIG. 2 is a timing diagram of various clock signals used in the FIG. 1 circuit.

The MSB's of the U and V samples provided by the ADC 7 are respectively coupled to the clamp circuits 4 and 5. The MSB's are extracted from the sequence of the interleaved samples available from the ADC 7 by the latchs 18 and 19 respectively responsive to the signal FM and its complement. Referring to FIG. 2, the row of boxes labeled I/O ADC illustrates in part the sequence of samples applied to the input and available from the output of the ADC 7. The rows of boxes labeled U LATCH and V LATCH correspond to the sequence of MSB's of the U and V samples available from the latches 18 and 19. It is noted that the MSB's applied back to the clamp circuits are delayed in time relative to the signal samples currently selected by the multiplexor. It is assumed that the signal level is substantially constant over the interval that clamping is performed, and thus these feedback delays in the MSB signal paths are inconsequential.

The signal FB identifies the signal intervals when the D.C. value of the transmitted signal should be at a predetermined level. In a video signal these intervals may correspond to the interval between the edge of the horizontal synchronizing pulses and active video, which intervals are related to the occurrence of pulses of the signal F SYNC. The signal FB may therefore be derived from the signals F SYNC and the system clock.

Consider that the signals U and V have an active interval corresponding to amplitude modulated sinusoids with a zero volt average value and an inactive interval, defined at least in part by the pulses of the signal FB. During the inactive interval the signal corresponds to a constant value, ideally zero volts. Assume that the ADC provides 8-bit binary sample values over the range 0-to-255 (decimal). These are all unipolar values, and are illustrated in part in FIG. 4. In FIG. 1 an inverter 8 is interposed in the most significant bit (MSB) line to invert the MSB, thereby converting the unipolar values provided by the ADC to two's complement samples. As such values applied to the processor 9 which have "0" and "1" MSB's are respectively considered as positive and negative values. In other words binary values equal or greater than 128 are reassigned the positive values zero to 127 and the binary values from 127 to 0 are reassigned the values −1 to −128. For the ADC 7 to appropriately respond to a bipolar signal of zero average value, the D.C. level of the bipolar signal must be clamped to the voltage corresponding to a level which provides a binary output of 128 (decimal). It may be seen from FIG. 4 that for any binary sample equal to or greater than 128 the MSB is a "1", and for any binary sample less than 128 the MSB is a "0". Since it is desired to establish the input D.C. level to a value corresponding to binary 128, the MSB may be used to control the input clamp circuitry. That is, if the MSB is a "1" or a "0" the clamp circuitry, responsive to the MSB is conditioned to decrement or increment the D.C. input level respectively. In the steady state the D.C. input level will oscillate above and below the voltage corresponding to the zero average value, however the amplitude of this oscillation may be made insignificant.

FIG. 5 illustrates, in part, the bit patterns for 8-bit two's complement digital values. It may be seen that all positive values have "0" MSB's and all negative values have "1" MSB's. Hence, if the ADC provides two's complement samples the MSB or "sign-bit" may be utilized to control the input clamp circuitry to adjust the input D.C. level to a value corresponding to zero volts.

Further, if the ADC provides samples in some alternative code which is subsequently converted to binary or two's complement form, the MSB of the converted samples may be used to control the input clamp circuitry.

Figure 3:
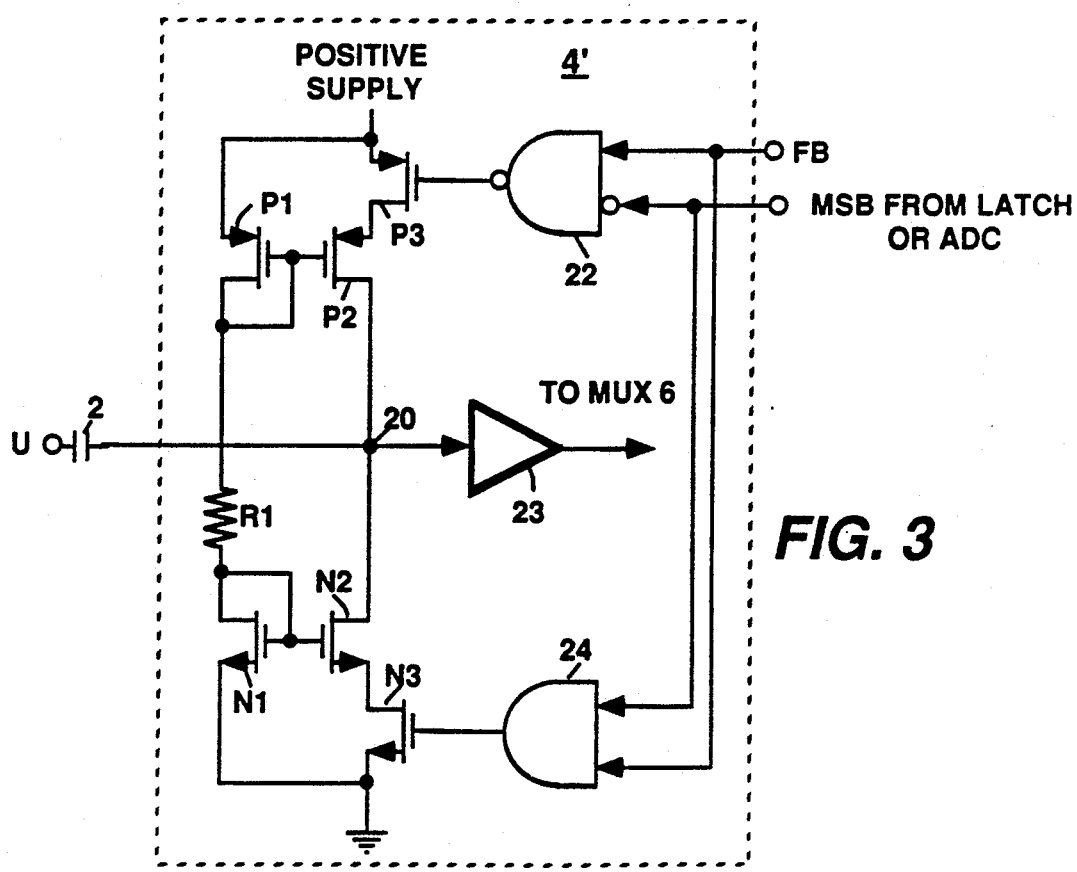
FIG. 3 is a circuit schematic of clamping circuitry embodying the invention.

FIG. 3 illustrates an example of clamp circuitry which may be implemented for the clamps 4, 5 and 14 shown in FIG. 1. In FIG. 3 a diode connected p-type transistor P1, a resistor R1 and a diode connected n-type transistor N1 are coupled in series between relatively positive and negative supply terminals. The current conducted in this series connection is a function of the supply potentials, the threshold potentials of the n and p-type transistos, and the resistance of the resistor R1, which current may be accurately predicted. The potentials developed at the gate electrodes of the respective transistors P1 and N1 are just sufficient to bias the transistor P1 and N1 to conduct this current. A second p-type transistor has its drain electrode coupled to the interconnection 20 of the coupling capacitor, e.g., capacitor 2, and the input of the multiplexer 6. The gate electrode of the transistor P2 is coupled to the gate electrode of the transistor P1 and the source electrode of transistor P2 is coupled to the positive supply terminal via a switch comprising transistor P3. When the switch P3 is closed the transistor P2 conducts a current to the interconnection 20, which current is proportional to the current conducted by the transistor P1. The current conducted by transistor P2 is integrated on the capacitor 20 and tends to raise the D.C. potential of the interconnection toward the positive supply potential. When the switch P3 is open circuited, forcing the transistor P2 out of conduction, the integrated charge on capacitor 2 holds the D.C. potential at the established value until transistor P2 is again conditioned to conduct. Transistors P1, N1, P2 and P3 form a gated current source for selectively sourcing current to the interconnection 20. Similarly transistors P1, N1, N2 and N3 form a gated current sink for selectively sinking current from interconnection 20.

The current sink and current source are conditioned by the gating circuits 24 and 22 to conduct during mutually exclusive time intervals.

The timing signal FB, which occurs over the signal clamping interval is applied to respective first input terminals of the gating circuits 22 and 24. The MSB provided by the latch (e.g. 18) or the ADC output is applied to respective second input terminals of the gating circuits 22 and 24. The output signals of the gating circuits 22 and 24 are nominally logic high and low values, respectively, which logic values maintain the switches P3 and N3 open circuited. During the occurrence of a pulse of the signal FB, if the MSB is a logic low value, the output of gating circuit 22 will exhibit a logic low value, and condition switch P3 to close. Alternatively, if the MSB is a logic high value, gating circuit 24 will exhibit a logic high output value and condition switch N3 to close. Thus depending upon whether the MSB is high or low during the clamping interval, one or the other of the gated current source or sink will conduct to cause the potential at the interconnection 20 to decrease or increase towards the desired value corresponding to a binary output of 128 (decimal).

In FIG. 3 a buffer amplifier is shown connected to the output of the clamping circuit 4'. This amplifier exhibits high input and low output impedence and is included to isolate the charge stored on the capacitor 2 when either the input to the ADC exhibits low impedance, or the clamp circuit is coupled to an input terminal of a multiplexor. In the latter instance, inclusion of the buffer precludes the D.C. level of one signal multiplexed to the input of the ADC from coupling back and influencing the D.C. level of a second signal multiplexed to the ADC. In the former instance, the buffer precludes the charge stored on the capacitor from leaking off and causing a D.C. drift.

It should be appreciated that the input signal need not exhibit a constant value during the adjustment interval, but may exhibit a constant amplitude oscillatory signal such as the color reference burst of a video signal. As long as the sample timing of the ADC is arranged to provide samples which are symmetric about the average value of the oscillatory signal, the clamp circuit will tend to converge the input D.C. level to the desired value.

What is claimed is:
1. In combination:
an analog signal input terminal for applying an input signal predetermined portions of which exhibit predetermined values;

control signal generating means for providing control signals indicating occurrences of ones of said predetermined portions;

an analog-to-digital converter for converting analog signals applied to an input terminal thereof, to digital samples having a plurality of bits including a most significant bit MSB;

means for coupling said analog signal input terminal to the input terminal of said analog-to-digital converter;

clamping circuitry coupled between said analog signal input terminal and the input terminal of said analog-to-digital converter, and responsive to said control signal and a single one of said plurality of bits, for adjusting the D.C. value of analog signals applied to said analog-to-digital converter.

2. The combination set forth in claim 1 wherein said clamping circuitry comprises;

a gated current sink and a gated current source having respective current output terminals coupled to the input terminal of said analog-to-digital converter, and having respective control electrodes;

logic circuitry, responsive to said control signal and said single one of said plurality of bits, for generating first and second switching signals, said switching signals being respectively coupled to the control electrodes of said gated current source and said gated current sink, said switching signals conditioning said gated current source and gated current sink to conduct mutually exclusively during said occurrences of ones of said predetermined portions.

3. The combination set forth in claim 2 further including a coupling capacitor coupled between said analog signal input terminal and the input terminal of said analog-to-digital converter.

4. The combination set forth in claim 1 wherein said means for coupling said analog signal input terminal to the input terminal of said analog-to-digital converter comprises:

a multiplexer having an output terminal coupled to the input terminal of said analog-to-digital converter and at least one input terminal;

a capacitor coupled between said analog signal input terminal and said at least one input terminal; and wherein said clamping circuitry is coupled between said capacitor and said multiplexer.

5. The combination set forth in claim 4 further including:

a further analog signal input terminal for applying a further input signal predetermined portions of which exhibit predetermined values;

a further capacitor coupled between said further analog signal input terminal and a second input terminal of said multiplexer;

a further clamping circuit coupled between said further capacitor and a second input terminal of said multiplexer, and responsive to said control signal and said single one of said plurality of bits, for adjusting the D.C. value of said further input signal applied to said analog-to-digital converter.

6. The combination set forth in claim 5 further including:

first and second latch means, having respective input terminals coupled to receive said single one of said plurality of bits of said digital samples, said first and second latch means having respective output terminals coupled to said clamping circuit and said further clamping circuit respectively, said first latch means conditioned to store the single one of said plurality of bits of selected ones of said digital samples and said second latch means conditioned to store the single one of said plurality of bits of other ones of said digital samples.

7. The combination set forth in claim 4 further including a buffer amplifier coupled between said capacitor and said at least one input terminal.

8. The combination set forth in claim 5 wherein said combination comprises a portion of a video signal processing system and said input signal and said further input signal are respective first and second modulated color difference signals.

9. The combination set forth in claim 1 wherein said single one of said plurality of bits corresponds to a sign bit.

10. The combination set forth in claim 1 wherein said single one of said plurality of bits corresponds to said MSB.

11. The combination set forth in claim 4 wherein said single one of said plurality of bits corresponds to said MSB.

* * * * *